(12) United States Patent
Minamino et al.

(10) Patent No.: US 6,715,937 B2
(45) Date of Patent: Apr. 6, 2004

(54) OPTICAL MODULE

(75) Inventors: Masayuki Minamino, Tokyo (JP); Tomoya Kato, Tokyo (JP); Takeo Shimizu, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/214,591

(22) Filed: Aug. 9, 2002

(65) Prior Publication Data

US 2003/0180010 A1 Sep. 25, 2003

(30) Foreign Application Priority Data

Mar. 19, 2002 (JP) ........................................ 2002-76860

(51) Int. Cl.[7] .................................................. G02B 6/42
(52) U.S. Cl. ......................................................... 385/92
(58) Field of Search ............................... 385/49, 88–94; 257/80–82, 431–433; 372/33–36

(56) References Cited

U.S. PATENT DOCUMENTS

| | | | | |
|---|---|---|---|---|
| 4,722,586 A | * | 2/1988 | Dodson et al. ............... | 385/92 |
| 5,132,532 A | * | 7/1992 | Watanabe .................... | 250/239 |
| 5,841,178 A | * | 11/1998 | Butrie et al. ................ | 257/433 |
| 6,420,205 B1 | * | 7/2002 | Sawai .......................... | 438/65 |
| 2002/0141709 A1 | * | 10/2002 | Shin ............................ | 385/92 |

FOREIGN PATENT DOCUMENTS

| | | | | |
|---|---|---|---|---|
| JP | 11095070 A | * | 4/1999 | ............ G02B/6/42 |
| JP | 2001085551 A | * | 3/2001 | ............ H01L/23/02 |
| JP | 2001127371 A | * | 5/2001 | ............ H01S/5/022 |
| JP | 2002359426 A | * | 12/2002 | ............ H01S/5/022 |

* cited by examiner

Primary Examiner—Hemang Sanghavi
Assistant Examiner—Scott A Knauss
(74) Attorney, Agent, or Firm—Oblon, Spivak, McClelland, Maier & Neustadt, P.C.

(57) ABSTRACT

A semiconductor laser module 1 having a package 2 containing a semiconductor laser device and lead pins 28 provided on both the side surfaces of the package 2. Since a base end portion of the lead pin 28 is fixed to the side surface at a position higher than the bottom surface of the package 2, the lead pin 28 can be laterally bent at a position higher than the bottom surface. Therefore, the semiconductor laser module 1 can be mounted on the surface of the wiring board 32 while the bottom surface of the package 2 is in close contact with the wiring board 32. Thus, since a heat radiation path from the bottom surface of the package 2 to the wiring board 32 is secured, it is possible to reduce the instability in the operating characteristic of the semiconductor laser device due to the thermal effect.

12 Claims, 8 Drawing Sheets

OPTICAL MODULE

BACKGROUND OF THE INVENTION

1. Field of the Invention

The present invention relates to an optical module for use in optical communication.

2. Description of the Related Art

An optical module of this kind has an optical semiconductor device contained in a package, and the optical semiconductor device is optically connected to an optical fiber via an optical system. The optical semiconductor device is operated by supplying electric power, and it can emit and receive laser light through the optical system and the optical fiber.

The operating characteristic of the optical semiconductor device is easily affected by the thermal effect. Therefore, it is important for the optical module to effectively restrain the variation in the operating characteristic of the optical semiconductor device inside due to the heat generated in its operation. For the stabilization of the operating characteristic of the semiconductor device against the temperature fluctuation, the method of forcible cooling using a thermomodule, which comprises a Peltier device, for example, and the method of natural cooling using a heat sink are available. From the standpoint of the power saving, the method using a heat sink is preferable.

On the other hand, in respect of the optical communication equipments using the optical module such as an optical amplifier and a signal light source, the reduction in the entire size thereof is required. Thus, the reduction in the mounting size of the individual optical modules is also required. For example, when employing the insertion mounting (also referred to as a "through hole mounting") in which an optical module is inserted into a wiring board, the so-called DIL (dual in-line) package is suitable to achieve the reduction in the mounting size. In the DIL package, several pairs of lead pins are provided on both the sides of the package and each of the lead pins extends downward from the side surface. Therefore, if the optical module is mounted with the lead pins being inserted in the through hole of the wiring board, the lead pins do not spread in the lateral direction. Therefore, the mounting area thereof can be reduced.

On the other hand, the heat generated in the optical module is usually radiated to the outside of the package through its bottom surface serving as a heat radiation path. In the DIL package, however, since the lead pins are protruded downward, it is difficult to arrange the heat sink or the like immediately below the package. Therefore, it is generally difficult to adopt the cooling method using the heat sink or the like in the DIL package.

SUMMARY OF THE INVENTION

The present invention disclosed and claimed herein, in one aspect thereof, comprises an optical module. The optical module comprises a package which contains an optical semiconductor device optically connected to an optical fiber via an optical system, the package having a bottom surface to be faced to a predetermined wiring board and a pair of side surfaces arranged on both the sides of the bottom surface and extending in the direction crossing the bottom surface; lead pins serving as conductors between the optical semiconductor device and the wiring board, each of the lead pins having a base end portion fixed at the side surface of the package and extending from this base end portion to the outside of the package; and a fixing region formed on the side surface of the package, in the fixing region, the base end portion of the lead pin being fixed to the position apart from the bottom surface of the package, thereby allowing the part of the lead pin lower than the base end portion to be detachable from the side surface of the package.

Further scope of applicability of the present invention will become apparent from the detailed description given hereinafter. However, it should be understood that the detailed description and specific example, while indicating preferred embodiment of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus, are not limitative of the present invention, and wherein.

DETAILED DESCRIPTION

Figure 1:
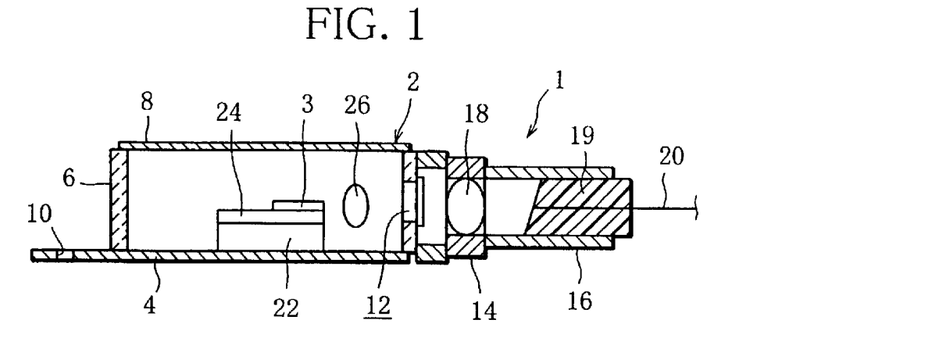
FIG. 1 is a sectional view schematically showing a structure of a semiconductor laser module.

FIG. 1 schematically shows a semiconductor laser module 1 as an example of an optical module. The semiconductor laser module 1 is provided with a block-shaped package 2. The package 2 contains a semiconductor laser device 3. The package 2 has a bottom plate 4 made of metal. A peripheral wall 6 made of ceramic is formed on the bottom plate 4, and the peripheral wall 6 is in the shape of a rectangular frame if viewed from above. Moreover, a top plate 8 is provided on the peripheral wall 6, and the top plate 8 covers an upper opening of the peripheral wall 6. Note that the bottom plate 4 has one edge portion projecting in the longitudinal direction, and an insertion hole 10 is formed on the projected portion. However, the projected portion of the bottom plate 4 is not necessarily required. In addition, the material of the bottom plate 4 is not limited to metal and the bottom plate 4 made of ceramic like the peripheral wall 6 can be used. Furthermore, the entire peripheral wall 6 is not necessarily made of ceramic, and a part of the peripheral wall 6 except that used to fix a later-described lead pin can be made of metal.

A through hole 12 is formed on a part of the peripheral wall 6 in the side opposite to the projected portion of the bottom plate 4. In line with the through hole 12, a lens housing 14 and a fiber support member 16 are sequentially connected on the peripheral wall 6 in this part. A condenser lens 18 is contained in the lens housing 14, and a ferrule 19 is contained in the fiber support member 16. Note that an optical fiber 20 is inserted in the ferrule 19.

In the package 2, a block 22 made of Cu—W is arranged on the bottom plate 4, and the block 22 is fixed to the bottom plate 4 by use of Sn—Pb solder. Moreover, the above-mentioned semiconductor laser device 3 is placed on the block 22 made of AlN. The semiconductor laser device 3 is die-bonded by use of Au—Sn solder. Similarly, the carrier 24 is fixed to the block 22 by use of Au—Sn solder.

A primary lens 26 is set in an upright state between the semiconductor laser device 3 and the through hole 12. More specifically, the primary lens 26 is set with its optical axis being horizontal. The laser light emitted from the semiconductor laser device 3 is converted into a parallel light through the primary lens 26, and the parallel light is irradiated to the through hole 12. Then, the parallel light is condensed at the condenser lens 18 and introduced into the optical fiber 20. Thus, the semiconductor laser device 3 is optically connected to the optical fiber 20 through the optical system consisting of the primary lens 26 and the condenser lens 18.

In the semiconductor laser module 1 having a structure shown in FIG. 1, the total thermal resistance from the bottom surface of the package 2 to the device 3 except that of the semiconductor laser device 3 itself is about 8° C./W. In this case, assuming that the heat radiated from the device 3 is about 0.5W, the temperature of the device 3 is expected to increase by about 4° C.

Figure 2A:
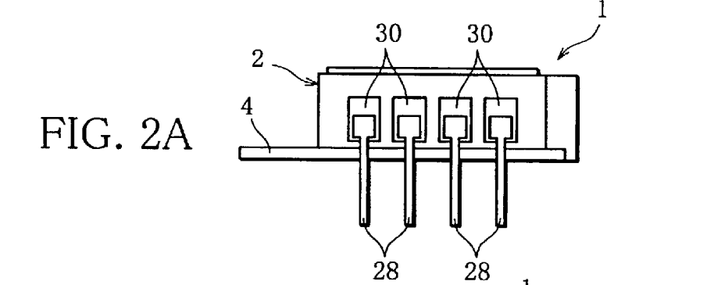
FIG. 2A is a side view specifically showing the semiconductor laser module according to the first embodiment.
Figure 2B:
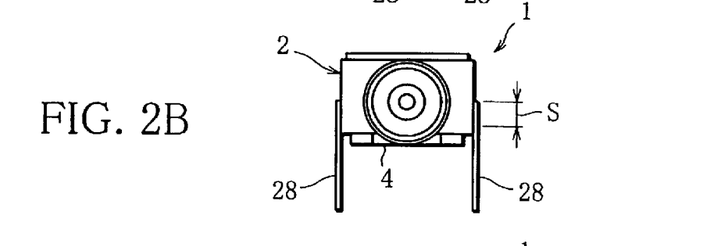
FIGS. 2B and 2C are front views specifically showing the semiconductor laser module according to the first embodiment.
Figure 2C:
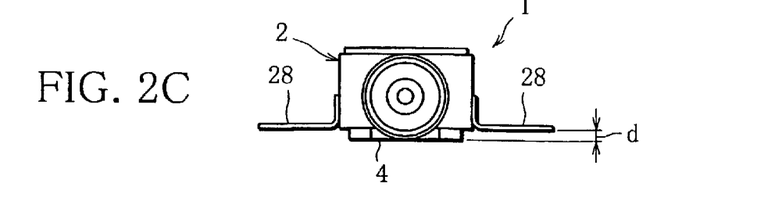

FIGS. 2A to 2C specifically show the lead pin 28 in the semiconductor laser module 1 according to the first embodiment. Four pairs of the lead pins 28 are provided to both the side surfaces of the package 2, and four lead pins 28 form one line along each side surface. Thus, the lead pins 28 form two lines each on the respective side surfaces of the package 2, and all of the lead pins 28 extend downward from the side surface. For that, the package 2 is a so-called DIL package. Note that, in the illustrated example, four pairs of the lead pins 28, more specifically, the total of eight pins are provided. However, the number of the lead pins 28 is not limited to this.

Four plating patterns 30 for use in the soldering are formed on each side surface of the package 2. The arrangement of these plating patterns 30 is determined depending on the number of the lead pins 28 to be attached (FIG. 2A). The base end portion of the lead pin 28 is widened to form a square-shaped pad providing a predetermined soldering area each corresponding to the plating pattern 30.

Each of the plating patterns 30 has a rectangular shape formed along the longitudinal direction of the lead pin 28, and the lower end thereof is positioned above the bottom surface of the package 2. Thus, each of the lead pins 28 is soldered within the range of the plating pattern 30, and the base end portion thereof is fixed to the side surface of the package 2 at a position above the bottom surface of the package 2. Therefore, the part of the end base portion of the lead pin 28 positioned higher than the lower end of the plating pattern 30 is the region fixed to the plating pattern 30 by soldering. That is, such a part is a fixing region S (FIG. 2B).

Furthermore, the fixing region S allows the part of the lead pin 28 lower than the base end portion to be detachable from the side surface of the package 2 without fixing it to the side surface of the package 2. Therefore, when bending the lead pin 28 laterally, the part of the lead pin 28 lower than the base end portion and outside the fixing region S can be detached from the side surface of the package 2, and the lead pin 28 can be bent laterally at the position above the bottom surface (FIG. 2C). Note that, in the case of the surface mounting of the semiconductor laser module 1, the distance d between the bottom surface of the package 2 and the lower surface of the bent lead pin 28 is preferably, for example, 0.2 mm or more.

Figure 3:
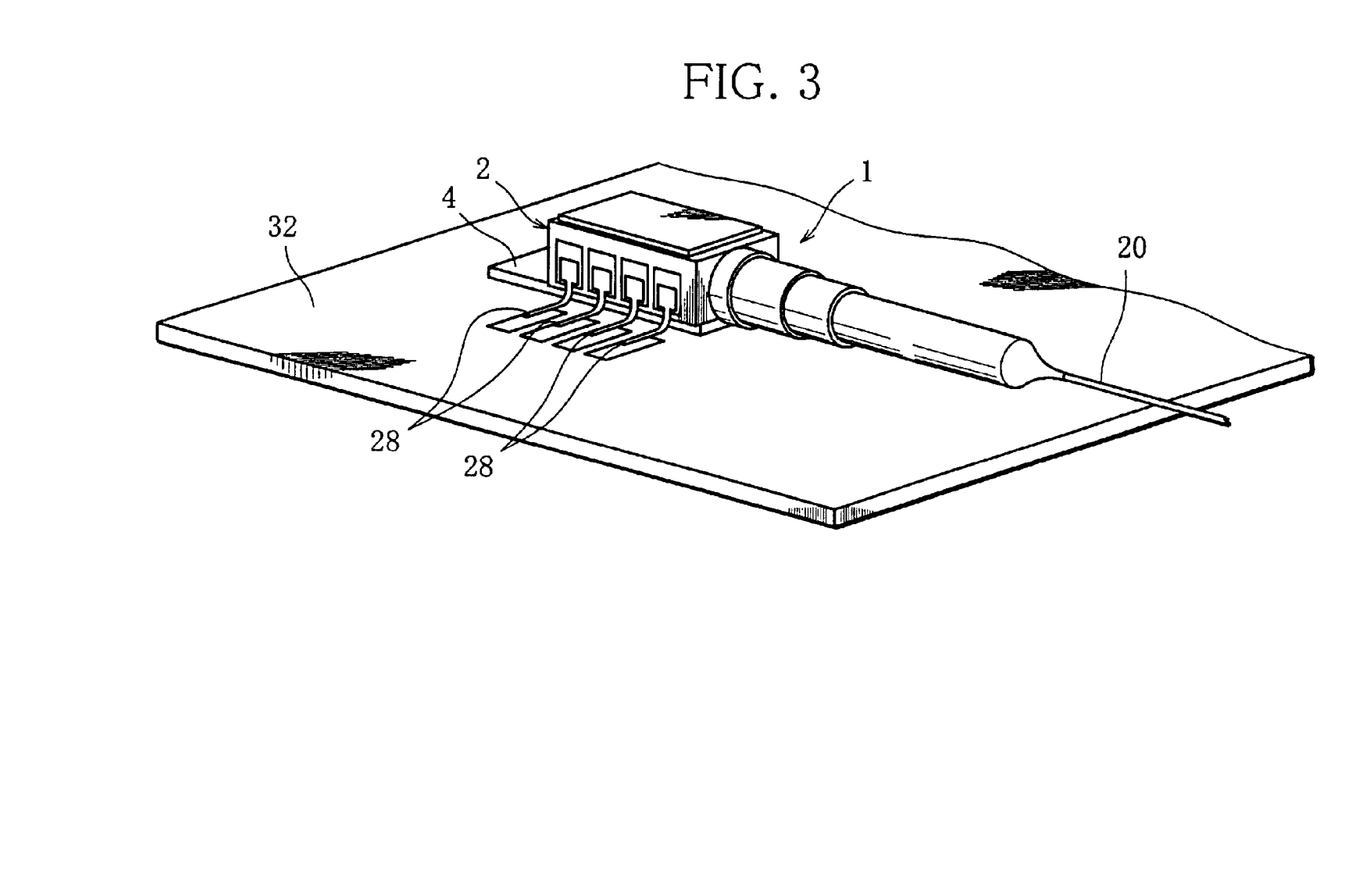
FIG. 3 is a perspective view illustrating the first mounting example of the semiconductor laser module.
Figure 4:
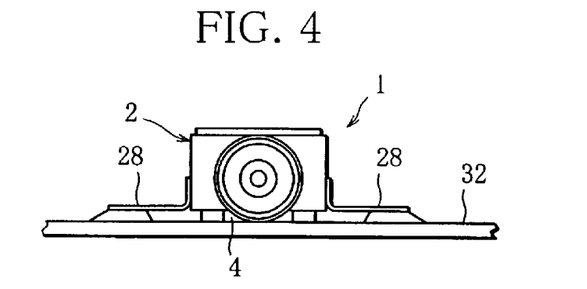
FIG. 4 is a front view illustrating the first mounting example of the semiconductor laser module.

FIGS. 3 and 4 show an example of the case where the semiconductor laser module 1 is surface mounted on a wiring board 32 according to the first embodiment. The first mounting example is implemented by, for example, the following mounting method.

The above-described bottom surface of the package 2 in the semiconductor laser module 1 is faced to the corresponding mounting surface of the wiring board 32. In this case, the positional relationship therebetween is as follows: assuming that the wiring board 32 is laid down, each of the lead pins 28 is laterally bent at the position above the bottom surface of the package 2. In this state, the lead pins 28 are soldered to the wiring board 32, and the bottom surface of the package 2 is in close contact with the surface of the wiring board 32, thereby obtaining the state of the surface mounting shown in FIGS. 3 and 4. In this case, since the lead pins 28 are laterally bent at the position above the bottom surface of the package 2, it is easy to bring the bottom surface of the package 2 in close contact with the mounting surface of the wiring board 32 when soldering the lead pins 28 to the wiring board 32. Note that, in this case, it is preferable to interpose grease between the bottom surface of the package 2 and the wiring board 32 because the interposition of the grease can improve the efficiency of heat radiation from the package 2 to the wiring board 32.

According to the first mounting example described above, by bringing the bottom surface of the package 2 in close contact with the wiring board 32, the heat radiation path from the bottom surface to the wiring board 32 can be secured. In this case, since the wiring board 32 can be used as a heat sink, the efficient cooling of the semiconductor laser device 3 in the package 2 can be achieved, and thus, the operating characteristic thereof can also be sufficiently stabilized. Note that, in the first embodiment, the temperature of the device 3 increases by about 6° C. Accordingly, it can be expected that the thermal resistance in the wiring board 32 and the contact surfaces of the wiring board 32 and the package 2 is about 0.5° C./W. In addition, since the bottom surface of the package 2 is in close contact with the wiring board 32, the height of the optical semiconductor module 1 when mounted can be reduced, which contributes to the downsizing thereof.

The usefulness of the optical semiconductor module 1 having the fixing region S becomes more apparent by the comparison with the prior art described below.

Figure 5A:
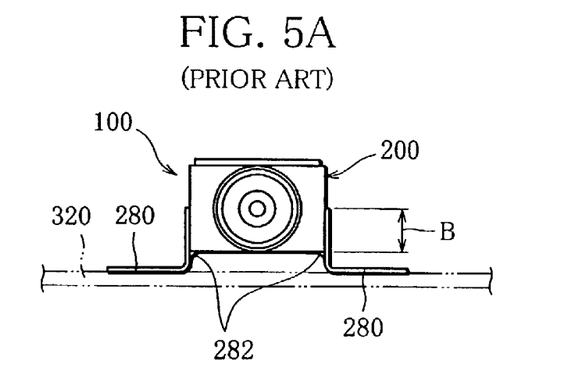
FIGS. 5A and 5B are front views showing the semiconductor laser module according to the prior art.

More specifically, as shown in FIG. 5A as a soldering region B, in the conventional DIL package, the lead pins 280 are soldered to the side surface of the package 200 till the lower end of the side surface (till a position equal to the bottom surface in terms of the vertical direction) with no space therebetween. Therefore, when laterally bending the lead pins 280, the bending position thereof is inevitably positioned lower than the bottom surface of the package 200, and the lead pins 280 cannot be laterally bent at the position higher than that position. Therefore, if the conventional lead pins 280 are bent laterally, the module 100 cannot be surface mounted while the bottom surface of the package 200 is in close contact with the wiring board 320.

Figure 5B:
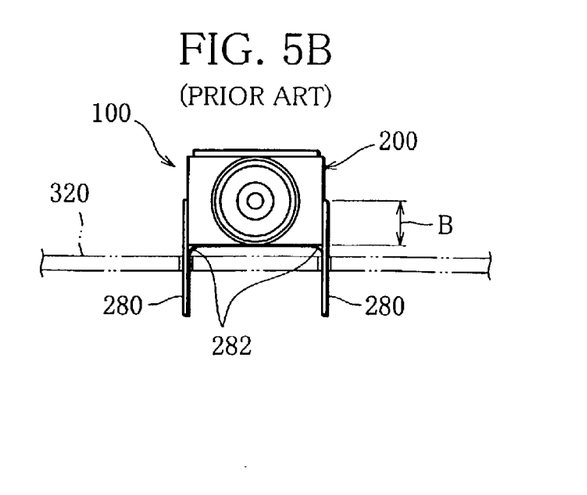

Furthermore, in the case of using the conventional lead pins 280, the superfluous solder when soldering the lead pins 280 moves down on the side surface and reaches the bottom surface of the package 200. As a result, fillets 282 are formed between the lead pins 280 and the bottom surface of the package 200. Consequently, in the case of the insertion mounting of the conventional module 100 into the wiring board 320, the bottom surface of the package 200 is inevitably floated from the surface of the wiring board 320 due to the interference of the fillet 282 as shown in FIG. 5B.

In this respect, no fillet exists between the lead pin 28 and the bottom surface of the package 2 in the semiconductor laser module according to the first embodiment, and the bottom surface is kept flat. Therefore, it is possible to securely bring the bottom surface of the package 2 in close contact with the wiring board 32 in both cases of the insertion mounting and the surface mounting.

Figure 6:
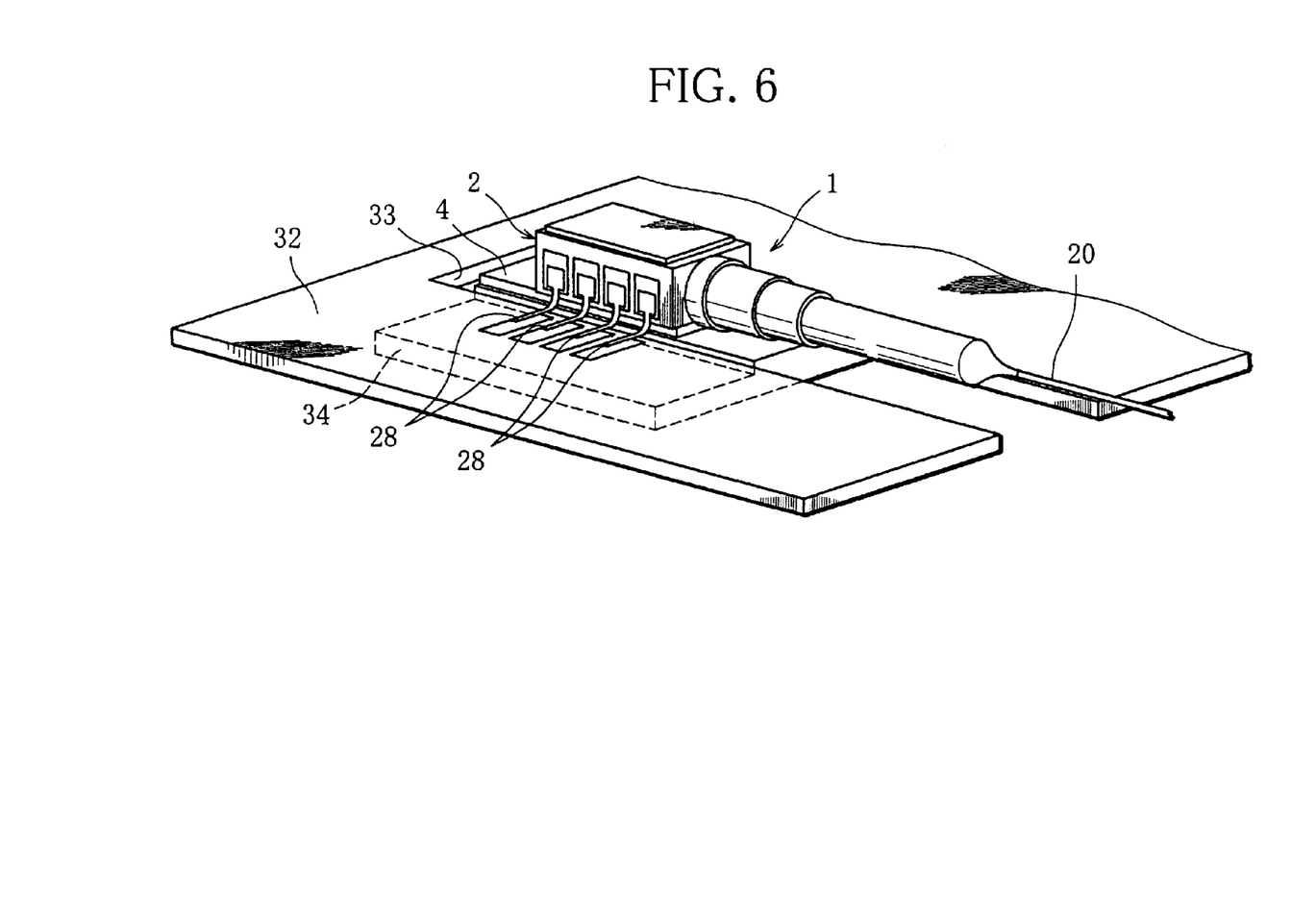
FIG. 6 is a perspective view illustrating the second mounting example of the semiconductor laser module.

FIG. 6 shows the second example of mounting the semiconductor laser module 1. In this mounting example, a part of the wiring board 32 immediately below the module 1 is cut out. Thus, an opening 33 is formed in the wiring board 32 at a position to which the bottom surface of the package 2 was to contact. In addition, a heat sink 34 made of aluminum is in close contact with the bottom surface of the package 2 through the opening 33. The heat sink 34 is formed in a convex shape, and the convex portion in its center has a width slightly wider than that of the bottom plate 4. Moreover, the heat sink 34 spreads from the central convex portion to both the sides thereof, and the wing parts thereof extend under the wiring board 32. Note that the shape and material of the heat sink 34 are not particularly limited.

Furthermore, in the second mounting example, it is possible to put the package 2 into the opening 33 of the wiring board 32 so as to bring the bottom surface of the package 2 in close contact with the heat sink 34 at a position lower than the upper surface of the wiring board 32. In this case, since the bottom surface of the package 2 moves downward in the thickness direction of the wiring board 32, the fixing region S of the lead pin 28 is provided at a position higher than that in the first mounting example (FIG. 2B), and thus, the above-mentioned distance d is increased in comparison to that in the first mounting example.

The second mounting example is implemented by, for example, the following mounting method.

The mounting method in this case is the same as that in the first mounting example in that the semiconductor laser module 1 shown in FIG. 2 is used. However, in the second mounting example, the opening 33 is formed by cutting off the part of the wiring board 32 which the bottom surface of the package 2 was to contact, and the heat sink 34 is brought into contact with the bottom surface through the opening 33, additionally. Note that either of the processes described below can be used for arranging the heat sink 34 into the opening 33. The first process is that, after soldering the lead pins 28 to the wiring board 32, the heat sink 34 is arranged in the opening 33. The second process is that, after the heat sink 34 is arranged in the opening 33, the bottom surface of the package 2 is brought in contact with it and then the lead pins 28 are soldered.

According to the second mounting example, the efficiency of the heat radiation from the bottom surface of the package 2 is enhanced by using the heat sing 34 having larger heat capacity, and thus, the semiconductor laser device 3 can be cooled without fail. In addition, in the case where the package 2 is moved down in the thickness direction of the wiring board 32, the mounting height from the wiring board 32 can be reduced.

Figure 8A:
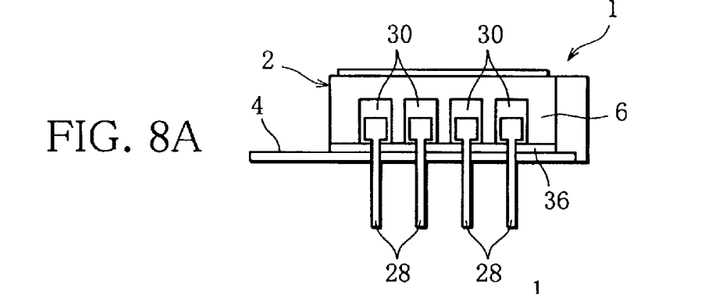
FIG. 8A is a side view specifically showing the semiconductor laser module according to the second embodiment.
Figure 8B:
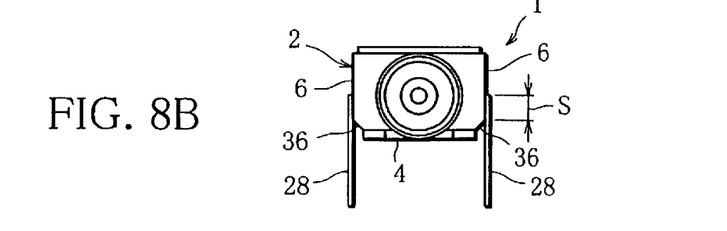
FIGS. 8B and 8C are front views specifically showing the semiconductor laser module according to the second embodiment.
Figure 8C:
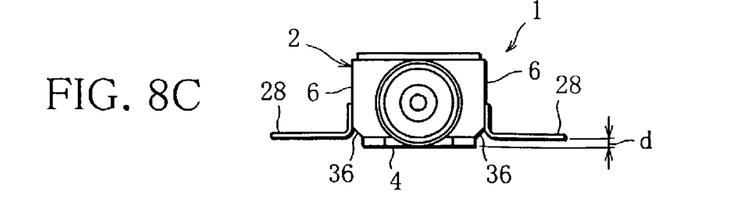

FIGS. 8A to 8C show the semiconductor laser module according to the second embodiment. In this embodiment, chamfer portions 36 are provided on both the side surfaces of the package 2, that is, on the lower portion of the side wall 6. These chamfer portions 36 are formed by obliquely cutting the corner portions between the bottom surface of the package 2 and the fixing region S of the lead pins 28. As a result, the plating patterns 30 are formed on both the side surfaces of the package 2 above the chamfer portions 36. Moreover, both the edge portions of the bottom plate 4 almost correspond to the borders of the chamfer portions 36 (FIG. 8B).

As shown in FIGS. 8B and 8C, the chamfer portion 36 forms a space between the bottom and side surfaces of the package 2 and the fixing region S. Therefore, the access to the lead pin 28 is facilitated owing to the space, and the process for bending the lead pin 28 is further facilitated.

Figure 9:
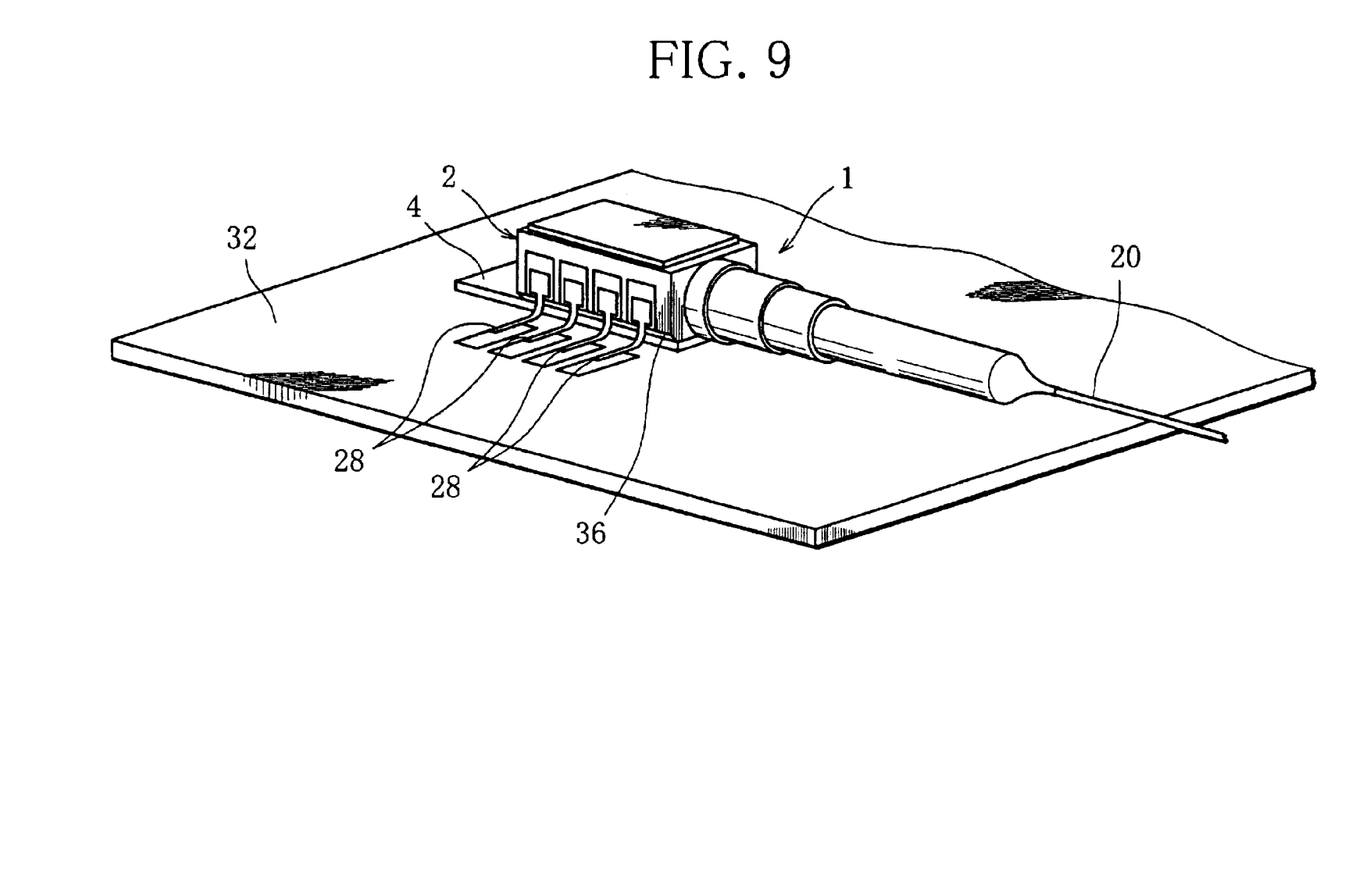
FIG. 9 is a perspective view illustrating the mounting example of the semiconductor laser module according to the second embodiment.
Figure 10:
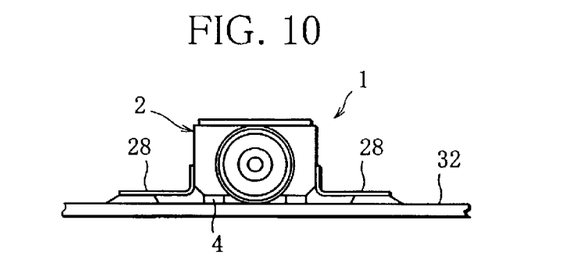
FIG. 10 is a front view illustrating the mounting example of the semiconductor laser module according to the second embodiment.

FIGS. 9 and 10 show an example of the case where the semiconductor laser module 1 according to the second embodiment is surface mounted. Also in this mounting example, the lead pins 28 can be laterally bent from the package 2 and soldered to the wiring board 32, and the bottom surface of the package 2 can be brought in close contact with the mounting surface of the wiring board 32.

Figure 11A:
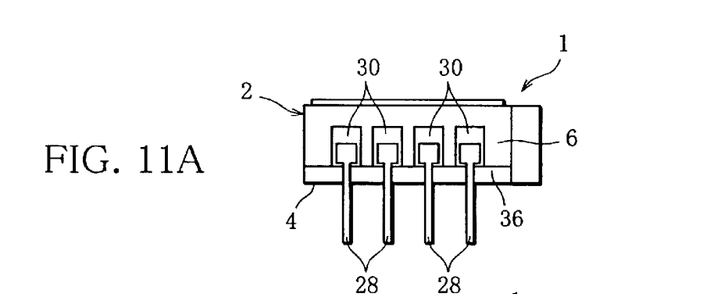
FIG. 11A is a side view specifically showing the semiconductor module according to the third embodiment.
Figure 11B:
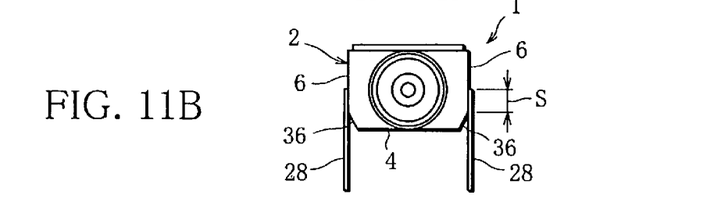
FIGS. 11B and 11C are front views specifically showing the semiconductor module according to the third embodiment.
Figure 11C:
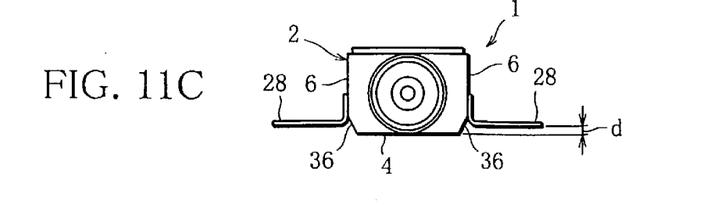

FIG. 11 shows the semiconductor module 1 according to the third embodiment. In this embodiment, the package 2 does not have the metal bottom plate. Instead of the metal bottom plate, the bottom plate 4 and the side wall 6 are integrally formed by laminating ceramic materials. Moreover, chamfer portions 36 are formed in each of the lower corner portions between the bottom surface and both the side surfaces. Similarly to the second embodiment, these chamfer portions 36 are formed by obliquely cutting the corner portions between the fixing region S of the lead pins 28 and the bottom surface of the package 2. As a result, the plating patterns 30 are formed on both the side surfaces of the package 2 above the chamfer portions 36.

As shown in FIGS. 11B and 11C, also in the third embodiment, the chamfer portion 36 forms a space between the bottom and side surfaces of the package 2 and the fixing region S, thereby the process for laterally bending the lead pin 28 is facilitated.

Figure 12A:
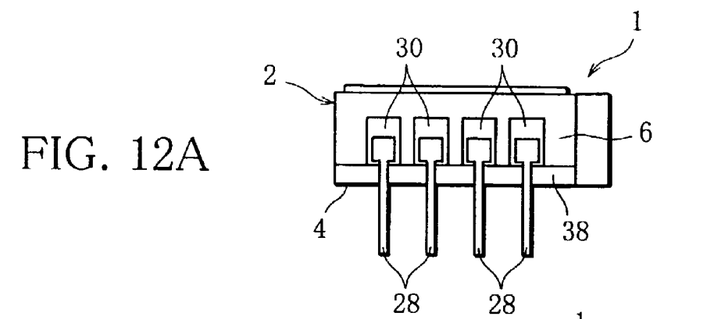
FIG. 12A is a side view specifically showing the semiconductor module according to the fourth embodiment.
Figure 12B:
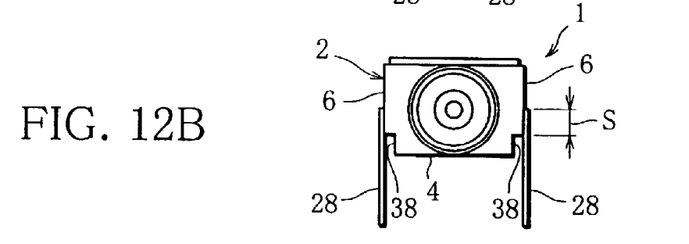
FIGS. 12B and 12C are front views specifically showing the semiconductor module according to the fourth embodiment.
Figure 12C:
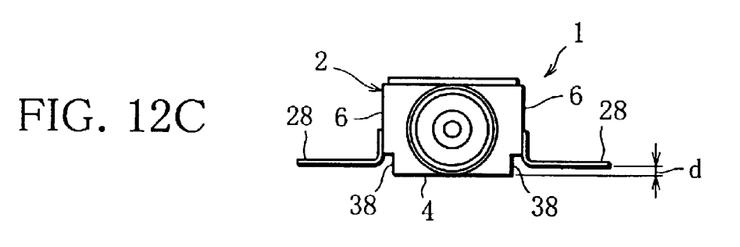

Furthermore, FIG. 12 shows the semiconductor laser module 1 according to the fourth embodiment. In this embodiment, instead of the chamfer portions 36 described in the third embodiment, notched grooves 38 are formed in each of the corner portions. The notched grooves 38 are formed by cutting the corner portions on both the sides along the longitudinal direction. By the notched groove 38, the corner portion between the fixing region S of the lead pin 28 and the bottom surface are cut off. As a result, the plating patterns 30 are formed on both the side surfaces of the package 2 above the notched grooves 38.

As shown in FIGS. 12B and 12C, also in the fourth embodiment, the notched groove 38 forms a space between the bottom and side surfaces of the package 2 and the fixing region S, thereby the process for laterally bending the lead pin 28 is facilitated.

In the case where the semiconductor laser module 1 according to the third and fourth embodiments is surface mounted on the wiring board 32, the mounting example thereof will be almost identical to that of the second embodiment (see FIGS. 9 and 10). However, in the semiconductor laser module 1 according to the third and fourth embodiments, the metal bottom plate 4 is not provided, and instead, the bottom surface of the ceramic bottom plate 4 serves as the bottom surface of the package 2. Also in this mounting example, since the heat radiation path from the bottom surface of the package 2 to the wiring board 32 is formed, the heat radiation efficiency of the semiconductor laser device 3 can be enhanced.

Particularly, since the chamfer portions 36 and the notched grooves 38 are formed in the semiconductor module 1 according to the third and fourth embodiments, the problem that the superfluous solder when soldering the lead pins 28 to the side surface of the package 2 moves down on the side surface and reaches the bottom surface of the package 2 can be prevented. Therefore, the bottom surface of the package 2 is kept flat, and the contact between the package 2 and the wiring board 32 is further increases.

Figure 7:
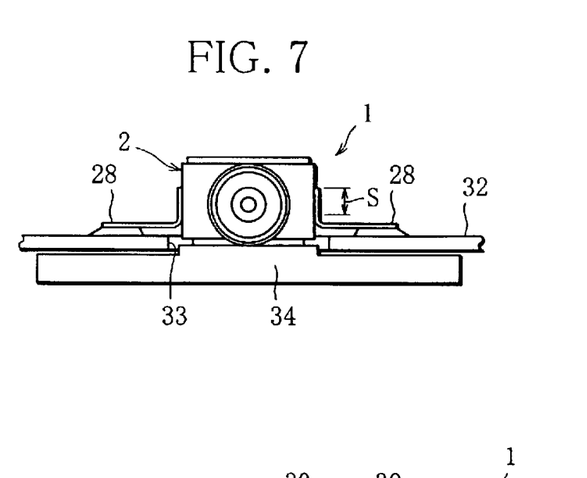
FIG. 7 is a front view illustrating the second mounting example of the semiconductor laser module.

Furthermore, the mounting examples shown in FIGS. 6 and 7 are also applicable to the semiconductor laser modules 1 according to the second to fourth embodiments. In this case, the opening 33 of the wiring board 32 and the heat sink 34 remain unchanged, and the shape of the package 2 is changed into that of the semiconductor laser module 1 according to the second to fourth embodiments. By applying these mounting examples, the advantages such as the enhancement in the heat radiation efficiency of the heat sink 34 and the downsizing in the mounting height can be achieved in the semiconductor laser module 1 according to the second to fourth embodiments.

Figure 13:
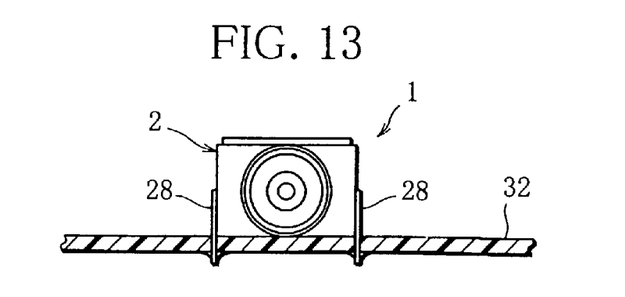
FIG. 13 is a front plan view illustrating an example of the through hole mounting of the semiconductor laser module.

Note that, in the mounting examples described above, the cases of the surface mounting are exemplified. However, as shown in FIG. 13, the insertion mounting into the wiring board 32 without bending the lead pins 28 is also applicable to the semiconductor laser module 1 according to the embodiments. In this case, since no fillet is formed on the bottom surface of the package 2 as described above, even if the metal bottom plate is not used in the package 2, the bottom surface of the package 2 can be brought in contact with the wiring board 32.

In the foregoing, the descriptions of the embodiments have been made. Essentially, more advantageous effects can be achieved by the present invention in comparison to the prior art. For example, according to the present invention, even the optical module having the DIL package can be mounted on the surface of the wiring board. In this case, the bottom surface of the package is brought in close contact with the wiring board and the heat sink, thereby greatly enhancing the heat radiation efficiency. Thus, the change in the characteristic of the optical semiconductor device due to the temperature fluctuation can be restrained, and it is possible for the optical semiconductor device to exert the stabilized performance.

Furthermore, in the present invention, since the bottom surface of the package is in contact with the wiring board, the downsizing in the mounting height of the optical module can be achieved. Particularly, in the case of the surface mounting, since the lead pins do not project into the rear surface of the wiring board, the clearance between the rear surface and the outside container can be minimized. Therefore, the big advantage of the downsizing in the entire size of the outside container can be achieved. Furthermore, the opening is formed in the wiring board and the bottom surface of the package is set into the opening, by which the mounting height from the wiring board can be reduced.

The semiconductor laser module 1 and the mounting method thereof according to the embodiments described above are preferable examples, and the present invention is not limited to them. For example, the concrete structure of the optical module is not limited to that shown in FIG. 1, and the one lens system can be used as the components consisting of the optical system. Moreover, the optical semiconductor device is not limited to the light-emitting device, and the light-receiving device can be also used.

Furthermore, the specification and application of the optical module are not particularly limited, and the present invention is applicable to the optical modules used for various applications.

Other than these, all of the components described with reference to the drawings are only the examples, and the modifications and replacement thereof can be made as needed.

What is claimed is:

1. An optical module comprising:
   a package which contains an optical semiconductor device optically connected to an optical fiber via an optical system, said package having a bottom surface to be faced to a predetermined wiring board and a pair of side surfaces arranged on both the sides of the bottom surface and extending in a direction crossing the bottom surface;

lead pins serving as conductors between the optical semiconductor device and the wiring board, each of said lead pins having a base end portion fixed at the side surface of said package and extending from the base end portion to the outside of said package; and a fixing region formed on the side surface of said package, in said fixing region, the base end portion of said lead pin being fixed to the position apart from the bottom surface of said package, thereby allowing a part of said lead pin lower than the base end portion to be detachable from the side surface of said package.

2. The optical module according to claim 1, further comprising:
   a chamfer portion formed on said package, said chamfer portion being formed by cutting off a corner portion between said fixing region on the side surface of said package and the bottom surface of said package.

3. The optical module according to claim 1, further comprising:
   a notched groove formed on said package, said notched groove being formed by cutting off the corner portion between said fixing region on the side surface and the bottom surface of said package along a longitudinal direction so as to extend in the longitudinal direction.

4. The optical module according to claim 1, wherein the part of said lead pin lower than the base end portion is fixed to the surface of the wiring board in the state of being bent in the direction apart from the side surface of said package, and said package is mounted to the wiring board in a state where the bottom surface thereof is in close contact with a surface of the wiring board.

5. The optical module according to claim 2, wherein the part of said lead pin lower than the base end portion is fixed to the surface of the wiring board in the state of being bent in the direction apart from the side surface of said package, and said package is mounted to the wiring board in a state where the bottom surface thereof is in close contact with a surface of the wiring board.

6. The optical module according to claim 3, wherein the part of said lead pin lower than the base end portion is fixed to the surface of the wiring board in the state of being bent in the direction apart from the side surface of said package, and said package is mounted to the wiring board in a state where the bottom surface thereof is in close contact with a surface of the wiring board.

7. The optical module according to claim 1, wherein the part of said lead pin lower than the base end portion is fixed to the surface of the wiring board in the state of being bent in a direction apart from the side surface of said package, an opening is provided in the wiring board at a position to be faced to the bottom surface of said package, and a heat sink is in close contact with the bottom surface of said package through the opening of the wiring board.

8. The optical module according to claim 2, wherein the part of said lead pin lower than the base end portion is fixed to the surface of the wiring board in the state of being bent in a direction apart from the side surface of said package, an opening is provided in the wiring board at a position to be faced to the bottom surface of said package, and a heat sink is in close contact with the bottom surface of said package through the opening of the wiring board.

9. The optical module according to claim 3, wherein the part of said lead pin lower than the base end portion is fixed to the surface of the wiring board in the state of being bent in a direction apart from the side surface of said package, an opening is provided in the wiring board at a position to be faced to the bottom surface of said package, and a heat sink is in close contact with the bottom surface of said package through the opening of the wiring board.

10. A method of mounting an optical module on a wiring board, comprising the steps of:

arranging a package, which contains an optical semiconductor device optically connected to an optical fiber via an optical system, to face a bottom surface of the wiring board;

laterally bending lead pins whose base end portions are adhered to both side surfaces of said package, said lead pins being bent at a portion lower than the base end portion, and in this state, setting a lower surface of said lead pin at a position above a bottom surface of said package; and fixing the bent lead pin to the surface of the wiring board, and bringing the bottom surface of said package in close contact with the surface of the wiring board.

11. A method of mounting an optical module on a wiring board, comprising the steps of:

arranging a package, which contains an optical semiconductor device optically connected to an optical fiber via an optical system, to face a bottom surface of the wiring board;

laterally bending lead pins whose base end portions are adhered to both side surfaces of said package, said lead pins being bent at a portion lower than the base end portion, and in this state, setting a lower surface of said lead pin at a position above a bottom surface of said package; and fixing the bent lead pin to the surface of the wiring board, and bringing a heat sink in close contact with the bottom surface of said package via an opening formed in the wiring board at a position to be faced to the bottom surface of said package.

12. The method of mounting an optical module according to claim 11, wherein the bottom surface of said package is moved down in the thickness direction of the wiring board through the opening, and the heat sink is brought in close contact with the bottom surface of said package at this position.

* * * * *